US007187074B2

(12) United States Patent
Uchiyama et al.

(10) Patent No.: US 7,187,074 B2
(45) Date of Patent: Mar. 6, 2007

(54) SEMICONDUCTOR AND ELECTRONIC DEVICE WITH SPRING TERMINAL

(75) Inventors: Taku Uchiyama, Kanagawa (JP); Souichi Okita, Nagano (JP)

(73) Assignee: Fuji Electric Device Technology Co., Ltd. (JP)

( * ) Notice: Subject to any disclaimer, the term of this patent is extended or adjusted under 35 U.S.C. 154(b) by 0 days.

(21) Appl. No.: 11/148,013

(22) Filed: Jun. 8, 2005

(65) Prior Publication Data

US 2005/0280490 A1 Dec. 22, 2005

(30) Foreign Application Priority Data

Jun. 8, 2004 (JP) ............................ 2004-169534
Nov. 10, 2004 (JP) ............................ 2004-325948

(51) Int. Cl.
*H01L 23/13* (2006.01)
*H01L 23/34* (2006.01)

(52) U.S. Cl. ...................... 257/706; 257/177; 257/178; 257/690; 257/698; 257/678; 257/687; 336/90

(58) Field of Classification Search ..................... None
See application file for complete search history.

(56) References Cited

U.S. PATENT DOCUMENTS 6,958,534 B2 * 10/2005 Stockmeier et al. ........ 257/706
2004/0245548 A1 * 12/2004 Stockmeier et al. ........ 257/202

FOREIGN PATENT DOCUMENTS

EP 1 381 115 B1 1/2004
JP 6-302734 * 6/1994
JP 2001-189416 A 7/2001

OTHER PUBLICATIONS

Annacker, R. et al., A New Platform for IGBT Modules, Flexible and expandable SEMiX family, PCLM Europe, Jul./Aug., 2003, p. 46-47.

SEMIKRON, Trade Catalog, SemiX 353GB126HDs, "Spring contact pad," p. 1-2.

* cited by examiner

*Primary Examiner*—Nathan J. Flynn
*Assistant Examiner*—Fazli Erdem
(74) *Attorney, Agent, or Firm*—Rossi, Kimms & McDowell LLP

(57) ABSTRACT

A semiconductor or electronic device, such as a power module uses at least one spring terminal as a control terminal. The spring terminal is led outside a case through a coil-accommodating member, which can be a frame or removable cover. With this arrangement, the spring terminal can be arranged at an arbitrary position inside the case. The spring terminal can be joined by soldering or bonding to the electrode of an in-case substrate while being held by the frame or cover. The in-case substrate can be accessed for solder joining through at least one aperture formed in the frame.

20 Claims, 6 Drawing Sheets

19
8
20
16
7
15
23
IV
IV
21
22
12

9
8
8
16
26
7
A
B
13
8
14
16
10
12
9
11
17
25
2

26
7
16
8
A
20b
21
22
12
19
20a
16a
16b
7a
20
17

26
7
15
12
16
8
20b
21
22
16b
20a
23
17

SEMICONDUCTOR AND ELECTRONIC DEVICE WITH SPRING TERMINAL

BACKGROUND

Powered electronics apparatuses, such as general purpose inverter, uninterruptible power supply, machine tool, and industrial robot, use power modules. Such power modules include a power-switching circuit in which a plurality of IGBT chips are combined, driving circuits for driving the IGBTs, and the like. These driving circuits are connected to various terminals formed outside the case. For example, a power module used in an inverter has, external P and N terminals for the input and output of direct-current power, and an external control terminal for control signals. Each control terminal is composed of a plurality of pins or plate-like tabs, each with one end connected to, e.g., driving circuits for IGBTs, and an insulating terminal block that holds these pins or tabs. The terminal block is attached to the case by a method such as postforming, adhesive joining, screwing, or the like.

In using such a power module, the user attaches a main circuit to the device (module) by screwing it into the terminal boards. In this case, a control circuit is attached to the device, i.e., the power module in the case, in the following manner. More specifically, a board that includes a control IC and the like is directly soldered to a pin or tab extending from the terminal block, or a pin or tab extending from the terminal block is inserted into a connecter connected or attached to the board.

As described above, a conventional semiconductor device requires soldering or the placement of connectors on the user's side, and the costs of wiring man-hours and parts are considerable. Under such circumstances, a semiconductor device with a structure that reduces the material cost and processing cost of the product by omitting the soldering of control terminals to a control-circuit board outside a case on the user's side has been proposed, for instance in Japanese Patent Laid-Open No. 2001-144249.

According to such a semiconductor device, each control terminal comprises a bellows spring or coil spring and is electrically connected to an external control-circuit board not by soldering, but by pressure contact using the elastic force of the control terminal. The control terminal is held in a resin case by being insert-molded onto the side walls of the resin case. The control terminals concentrated on the side walls of the resin case are joined to an in-case substrate through the use of bonding wires.

However, in such a conventional semiconductor device, all control terminals are insert-molded onto the side walls of a resin case, and the positions of the control terminals are limited to the vicinity of the periphery of the resin case. Accordingly, even if the user desires to minimize the wiring between the control terminals and the external control-circuit board by arranging the control terminals in the center of the semiconductor device, not only in an in-case substrate but also in the external control-circuit board connected through the control terminals, wires must be guided from their interconnection positions at least to the positions of the side walls. Therefore, there is little flexibility in the positions of the control terminals and the wiring layout.

Accordingly, there still remains a need for a semiconductor/electronic device without the problems mentioned above. The present invention addresses this need.

SUMMARY OF THE INVENTION

The present invention relates to a semiconductor device such as a power converter, inverter unit and, more particularly, to the structure of a control terminal in a semiconductor device, such as an IGBT (conductivity-modulated transistor), and an electronic device that uses such a semiconductor device.

One aspect of the present invention is a semiconductor device, which can be a power semiconductor part or power module. It can have a case, a substrate with an electrode inside the case, at least one spring terminal electrically connected to the electrode, and a coil-accommodating member connected to the case. The spring terminal can have a coil part with one end for contacting an external control-circuit board attachable to the case, a straight part formed integrally with the other end, which is opposite the one end of the coil part, and extending substantially coaxially with the coil part, and a terminal end formed integrally with the straight part at the end opposite to the end connecting to the coil part, and joined to the electrode. The coil-accommodating member includes a coil-accommodating part for accommodating the coil part of the spring terminal therein.

The coil-accommodating member can be a cover or frame. In one embodiment, the frame has the coil-accommodating part and at least one aperture that allows access to the terminal end of the spring terminal while the coil-accommodating member is connected to the case and the coil part is held by the coil-accommodating part. It can include a cover that covers the frame while allowing passage of the coil-accommodating part through the cover.

In another embodiment, the coil-accommodating member is the cover. This embodiment can further include the frame having at least one aperture that allows access to the terminal end of the spring terminal while the frame is connected to the case and the coil part is held by the coil-accommodating part. The cover can cover the frame.

The coil-accommodating part is configured to allow insertion of the spring terminal in only one way. The coil-accommodating part can include a spring-terminal pressure-receiving part that serves as a basis for flexure of the coil part when the case and the external control-circuit board are fastened together, and the flexure stress in the coil part of the spring terminal is received only by the spring-terminal pressure-receiving part. The spring-terminal pressure-receiving part can be tapered.

The coil part of the spring terminal can be composed of a first coil part with a small diameter having one end for contacting with the external control-circuit board and a second coil part that is formed integrally and substantially coaxially with the other end of the first coil part and having an outer diameter larger than the outer diameter of the first coil part. The coil-accommodating part can have an opening smaller than the diameter of the second coil part to prevent the spring terminal from coming out through the opening.

The terminal end of the spring terminal can be joined to the electrode with a solder or a conductive adhesive, and can be irregularly shaped or ring-shaped.

Another aspect of the present invention is an electronic device that includes the semiconductor device mentioned above with an external control-circuit board attached to the case.

DETAILED DESCRIPTION

By way of example, embodiments to which the present invention is applied to, namely a semiconductor device and electronic device using a power module, such as an IGBT power module, will be explained in detail below with respect to the drawings.

Figure 1:
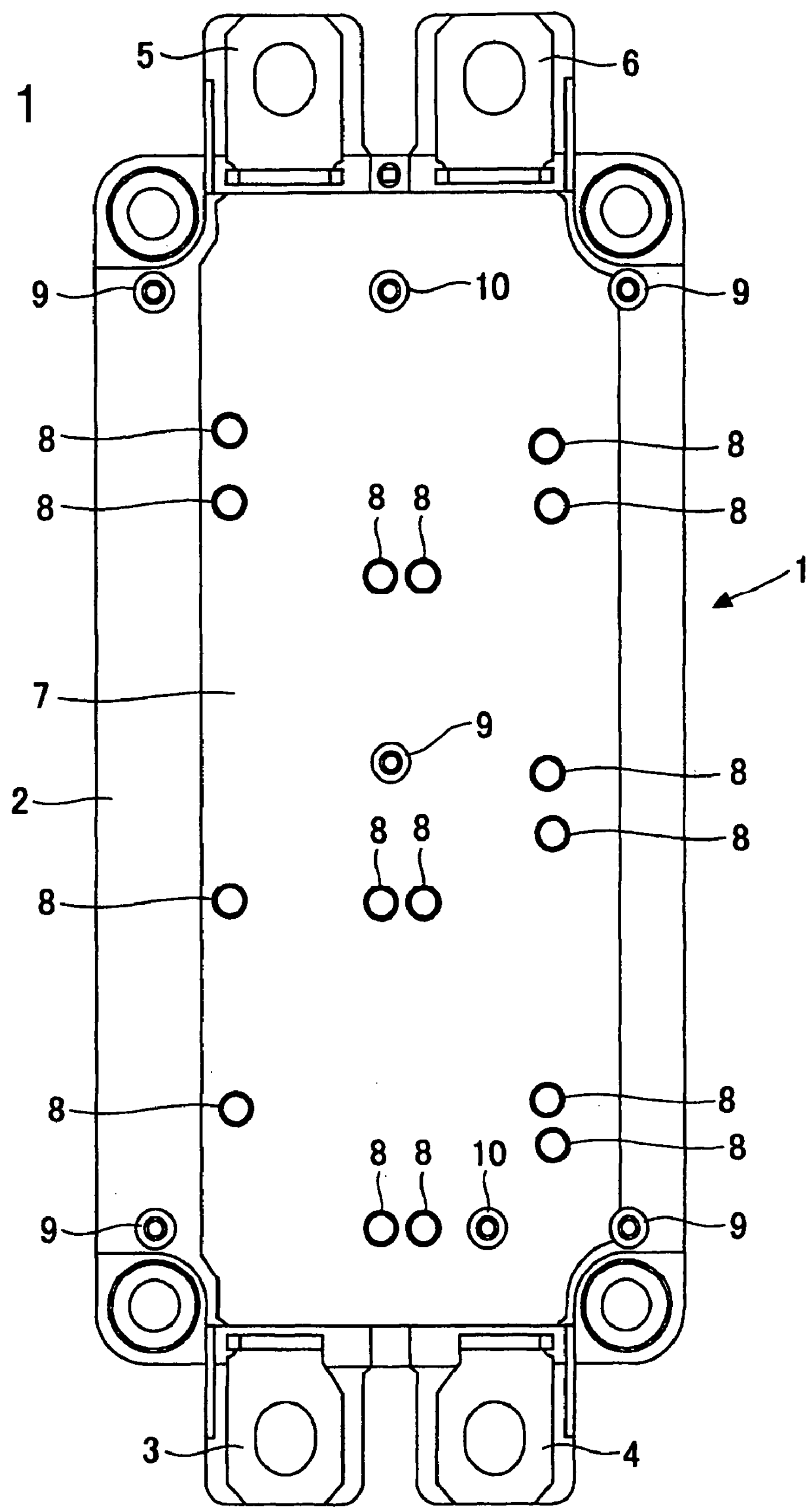
FIG. 1 illustrates a plan view of a semiconductor device, such as an IGTB power module, according to the present invention.

Referring to FIGS. 1–4, an IGBT power module 1 having a configuration shown in FIG. 1 comprises a case 2 and a semiconductor device(s), such as an IGBT 13, which is a power semiconductor part in the case 2. The IGBT power module 1 also includes terminal boards or terminals 3 and 4 for direct-current power input and terminal boards or terminals 5 and 6 for power output, extending externally outwardly from the case 2, which constitutes an outer frame, and spring terminals 8 for control signals led out through a cover 7, which can be removable. The case 2 also includes screw holes 9 and pins 10. The user positions a control-circuit board using the pins 10 formed integrally with the cover 7 outside the IGBT power module 1, and fastens the control-circuit board to the screw holes 9. In this IGBT power module 1, the spring terminals 8 serve as control terminals for the control signals. Thus, the user can screw the external control-circuit board into the IGBT power module 1. This makes it possible to maintain the load on the current-carrying part of each spring terminal 8 at an appropriate level and eliminates the need for, e.g., soldering of the external control-circuit board or placement of connectors at the user's end.

Figure 2:
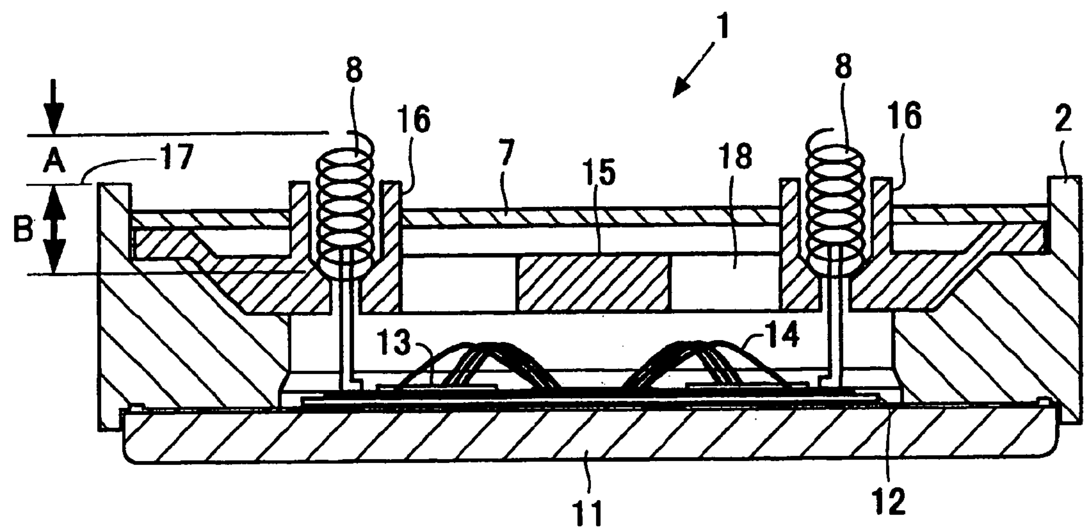
FIG. 2 illustrates a sectional view of FIG. 1 showing a first embodiment of the control terminal attachment structure thereof.

As shown in FIG. 2, the IGBT power module 1 can have, in its interior, a base 11 for heat dissipation and an in-case substrate 12 mounted on the base 11. The in-case substrate 12 can use ceramic as a base material and can have a lower surface covered with a copper plate soldered on the base 11. A circuit pattern is formed on the front or upper surface of the in-case substrate 12. The power semiconductor part comprises the in-case substrate 12, IGBT(s) 13 mounted on the in-case substrate 12, and a semiconductor device(s) such as a Free Wheeling Diode(s) (FWD), not shown, further mounted on the in-case substrate 12. Electrodes formed on a rear or bottom surface of the IGBT 13 and the FWD are connected to a circuit pattern in the in-case substrate, and electrodes formed on the front or upper surface are connected to the circuit pattern by wires 14. One end of the spring terminals 8 is joined to the electrodes for control signals in the power semiconductor part, in particular to a circuit pattern connected to gate terminal of the IGBT 13 with either a solder or a conductive adhesive. The semiconductor device can be composed as an Intelligent Power Module (IPM), which can be an IGBT power module with a built in driving circuit for IGBT 13. A driving circuit output control signals a gate of the IGBT 13 after receiving a control signal from outside the control circuit board. The IPM can be the IGBT 13 connecting a control circuit through the spring terminals 8. That is, one end of a drive circuit can be connected to a circuit pattern connected to the spring terminals 8 with a solder.

A coil-accommodating member 15, which is an internal frame, can be arranged inside the cover 7, and coil-accommodating parts 16 made of resin can be formed integrally with the frame 15 at the positions at which the spring terminals 8 are arranged. Each spring terminal 8 is held by the corresponding coil-accommodating part 16 of the frame 15 while being extended, by the spring flexure tolerance A, from a plane 17 contacting the external control-circuit board (hereinafter referred to as a "board contact plane"). Accordingly, when the external control-circuit board (not shown) is positioned using the positioning pins 10 and then fastened to the IGBT power module 1 through the screw holes 9 for board fastening with reference to the board contact plane 17, the external control-circuit board compresses the spring terminals 8 to the spring set length B.

The board contact plane 17 of the control-circuit board can be higher than the coil-accommodating parts 16 of the frame 15, and need not be level with them. The flexure tolerance A for the spring terminals 8 is defined by the height of the screw holes 9 for board fastening formed in the case 2, i.e., the position of the board contact plane 17. This prevents excessive pressure from being exerted by the control-circuit board on the frame 15 through the spring terminals 8.

The frame 15 as a whole can be formed in, e.g., a grid, and can have a large number of apertures 18. These apertures 18 allow a soldering iron or hot gas access to parts where the spring terminals 8 are joined to the electrodes for control signals of the driving circuits mounted on the in-case substrate 12, while the frame 15 is set in the case.

Figure 3:
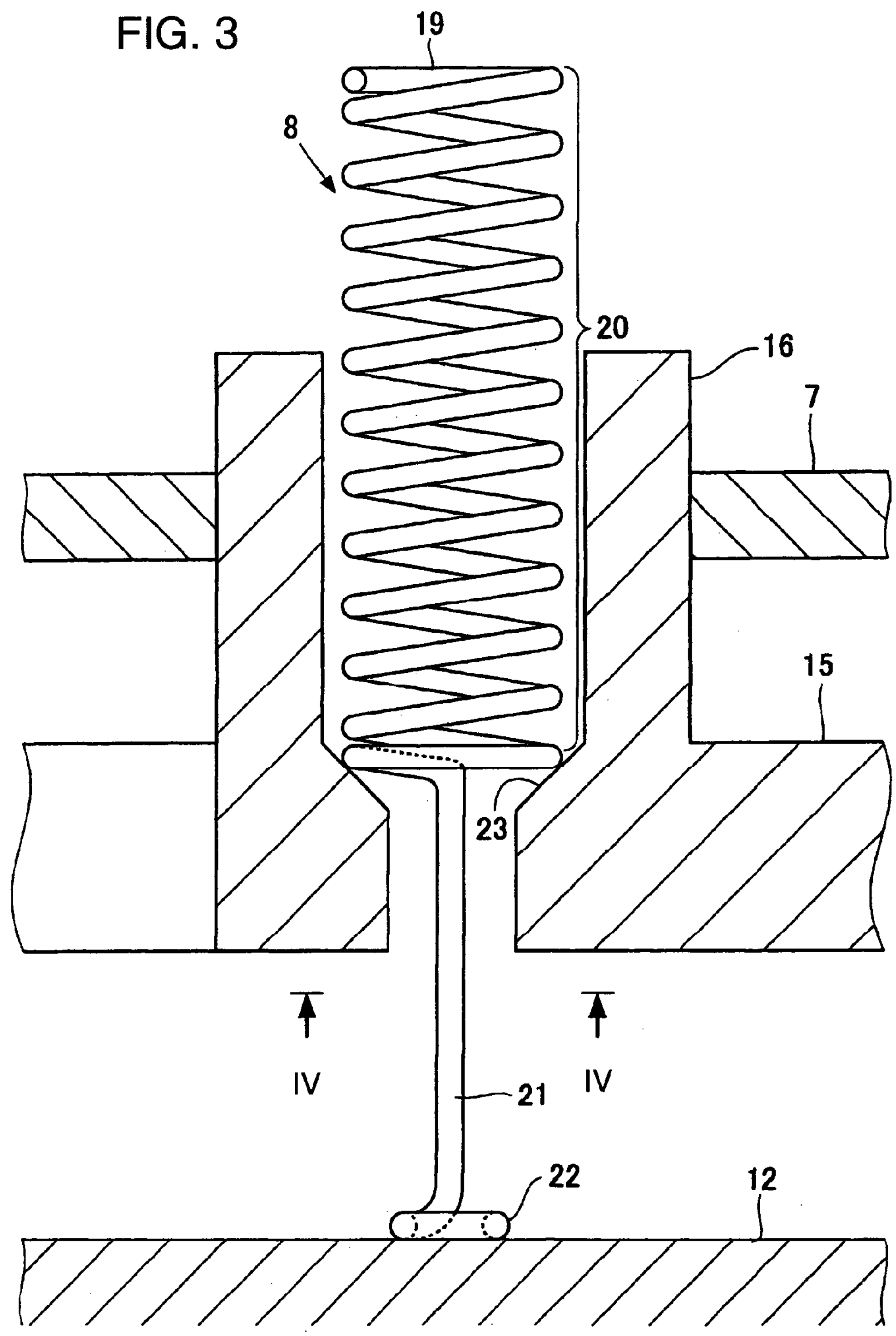
FIG. 3 illustrate an enlarged detailed view of each of the control terminals of FIG. 2.

As shown in FIG. 3, each spring terminal 8 has a coil part 20 that has, at its upper end, a terminal contact surface 19 in direct pressure contact with the external control-circuit board, a straight part 21 that is integrally formed at the lower end of the coil part 20 and extends coaxially or substantially coaxially with the coil part 20, and a joining part or terminal end 22 that is integrally formed at the lower end of the straight part 21 and is joined to the corresponding electrode of the in-case substrate.

The coil-accommodating part 16 of the frame 15, in which the coil part 20 of each spring terminal 8 is accommodated, has a tapered spring-terminal pressure-receiving part 23 against which the lower end of the coil part 20 abuts. Accordingly, when the external control-circuit board is fastened to the IGBT power module 1, the coil part 20 of the spring terminal 8 flexes against the spring-terminal pressure-receiving part 23. This brings the terminal contact surface 19 into pressure contact with a circuit arranged on the external control-circuit board by an appropriate spring force, and ensures continuity.

The coil-accommodating part 16 is configured to allow insertion of the spring terminal 8 in only one way. In this embodiment, the spring terminal 8 is inserted through the frame 15 from the top, with respect to the figures.

The side opposite the terminal contact surface 19 of the spring terminal 8 comprises a straight part 21 for ensuring continuity with the in-case substrate 12. The straight part 21 is of a length corresponding to the distance from the lower end of the coil part 20 to the in-case substrate 12, and can be joined by soldering or bonding to the corresponding electrode of the in-case substrate 12. The straight part 21 is arranged coaxially or substantially coaxially with the coil part 20 to prevent rotational movement of the spring terminal 8 when it is inserted into the corresponding coil-accommodating part 16 of the frame 15. In view of enhancing resistance to thermal fatigue, the joining part 22 can have a ring-like structure or an irregular configuration to increase its joint area.

When the joining part 22 of the spring terminal 8 is joined to the electrode of the in-case substrate 12, the straight part 21 of the spring terminal 8 is arranged between the spring-terminal pressure-receiving part 23 and the electrode of the in-case substrate 12. One end of the straight part 21 is fixed to the electrode of the in-case substrate 12 by solder joining or bonding using conductive adhesive, and the other end is locked by the spring-terminal pressure-receiving part 23.

The IGBT power module 1 can use a heat-resistant ceramic as a base material, which can serve as the insulating material for the in-case substrate 12, and the in-case substrate 12 can have a different coefficient of linear expansion from the base 11 on which the in-case substrate 12 is soldered. For this reason, when heat is generated while the IGBT power module 1 is operating, the difference in the coefficient of linear expansion between the components joined together by soldering causes warpage in the base 11. When warpage occurs in the base 11, relative displacement occurs between the position of the joining part 22 of each spring terminal 8 and that of the spring-terminal pressure-receiving part 23 of the corresponding coil-accommodating part 16, stressing the straight part 21 and the joining part 22 of the spring terminal 8. One of the spring terminals 8 arranged near the center of the base 11 undergoes significant relative displacement (in some cases, a displacement of several hundred μm). This causes a large amount of stress in the joining part 22 of the spring terminal 8, thus leading to a decrease in reliability.

Figure 4:
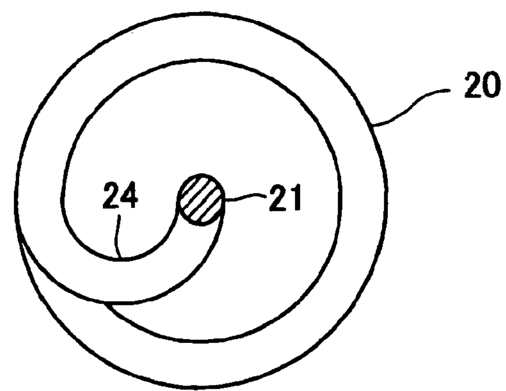
FIG. 4 illustrates a sectional view of FIG. 3 as seen from the direction indicated by arrows IV.

Stress on the joining part 22 caused by such frequent thermal cycles can be prevented by tapering the spring-terminal pressure-receiving part 23. More specifically, by tapering the spring-terminal pressure-receiving part 23, only the periphery of the coil part 20 of the spring terminal 8 is supported by the spring-terminal pressure-receiving part 23. As shown in FIG. 4, a connecting part 24 connecting the coil part 20 and straight part 21 is present between them. The springiness or the flexibility of the connecting part 24 absorbs the relative displacement between the joint of the joining part 22 and the spring-terminal pressure-receiving part 23, enabling the stress on the joint of the joining part 22 to be relieved.

In the above embodiment, the spring-terminal pressure-receiving part 23 is tapered such that the connecting part 24 can be deformed in the axial direction of the straight part 21. The periphery of the coil part 20 of the spring terminal 8 can be solely supported by the spring-terminal pressure-receiving part 23. Accordingly, the spring-terminal pressure-receiving part 23 can have a level difference or can be configured so as to support only the periphery of the coil part 20.

Figure 5:
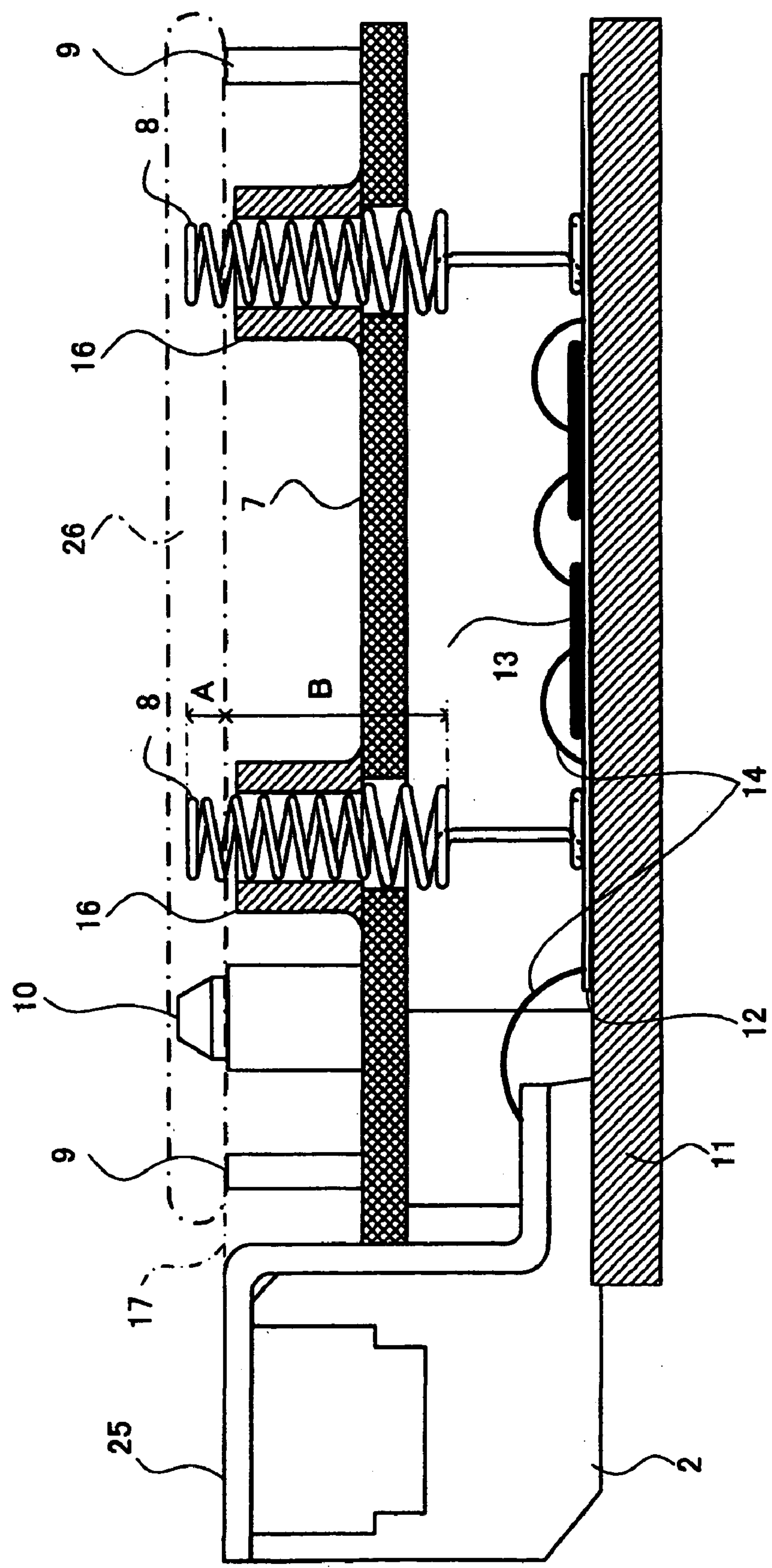
FIG. 5 illustrates a sectional view showing a second embodiment of the control terminal attachment structure according to the present invention.
Figure 6:
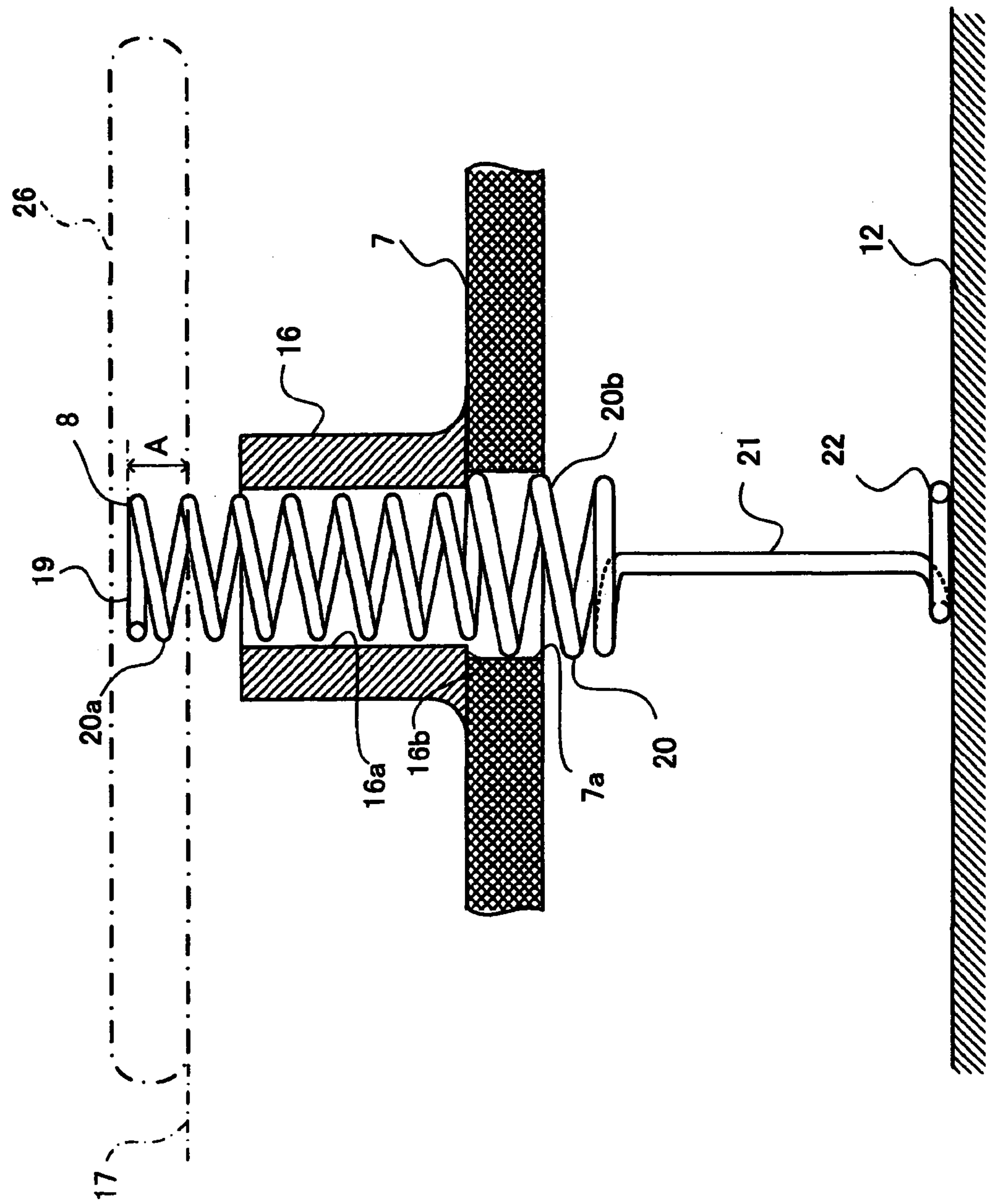
FIG. 6 illustrates an enlarged detailed view of each of the control terminals of FIG. 5.
Figure 7:
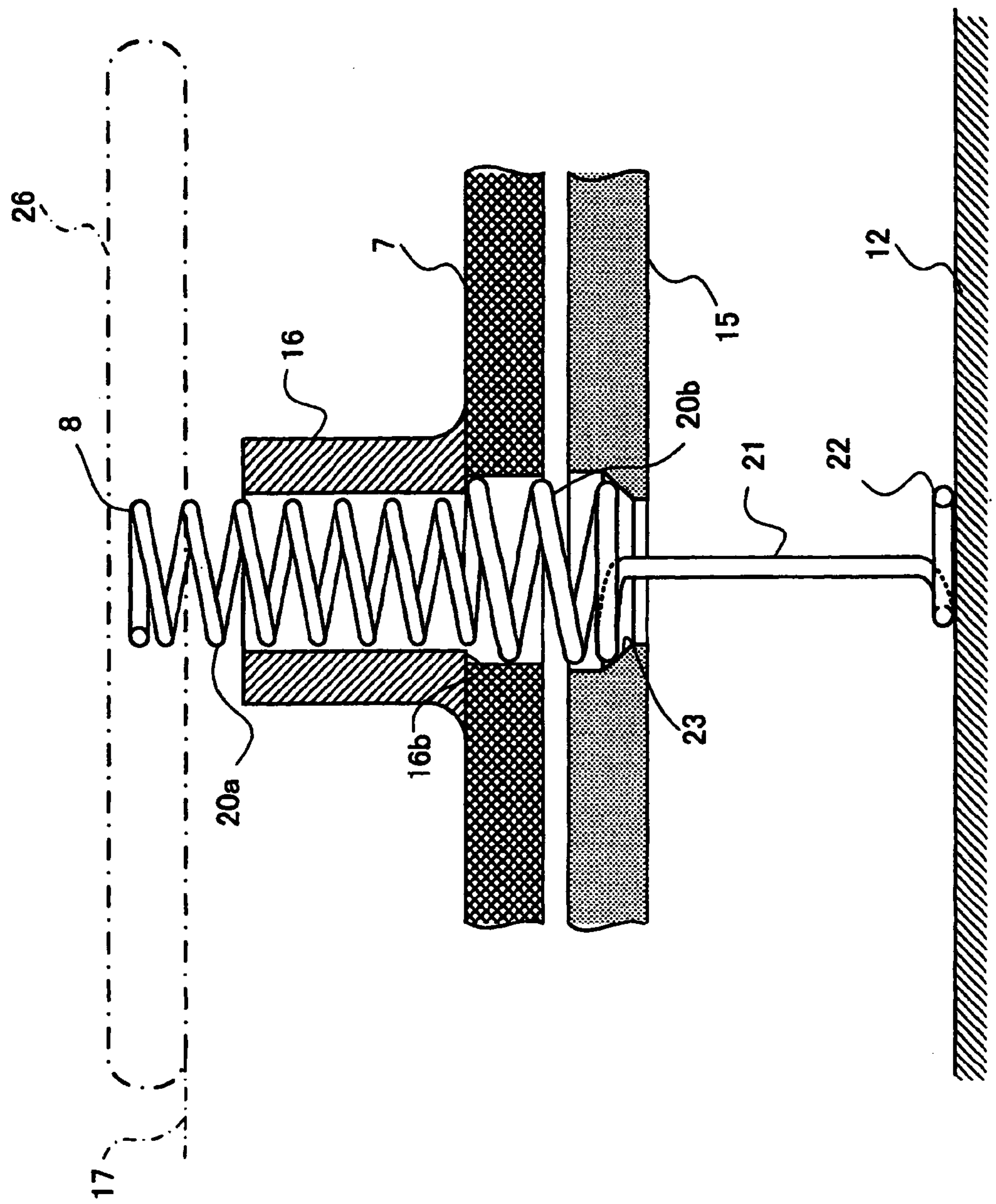
FIG. 7 illustrates a detailed view showing the control terminal attachment structure of FIG. 6 as positioned by a frame.

Referring to FIGS. 5–7, which show alternative embodiment of the arrangement of the control terminals, the IGBT power module 1 itself can be accommodated in the case 2 as shown in FIG. 2, and can have a similar appearance. As shown in FIG. 5, the in-case substrate 12 can similarly use ceramic as a base material and can have a lower surface covered with a copper plate soldered on the base 11 for heat dissipation in the case 2 of the IGBT power module 1. A circuit pattern is formed on the front or upper surface of the in-case substrate 12. The power semiconductor part comprises the in-case substrate 12, the IGBT(s) 13 mounted on the in-case substrate 12, and a semiconductor device(s) such as a Free Wheeling Diode(s) (FWD), not shown, further mounted on the in-case substrate 12. Electrodes formed on rear or bottom surface of the IGBT 13 and the FWD are connected to a circuit pattern in the in-case substrate, and electrodes formed on front or upper surface are connected to the circuit pattern by wires 14. One end of the spring terminals 8 is joined to the electrodes for control signals in the power semiconductor part, in particular to a circuit pattern connected to gate terminal of the IGBT 13 with either a solder or conductive adhesive. Main electrodes of the power semiconductor(s), in particular collector electrode of IGBT, emitter electrode of IGBT, an anode electrode of FWD, and cathode electrode of FWD are connected to a main electrode 25 in the case 2. The main electrodes of a power semiconductor can be connected to the main electrode 25 with the wires 14. Alternatively, the main electrode 25 can be connected to the circuit pattern 12 connected to the main electrode of power semiconductor. The semiconductor device can be composed as an Intelligent Power Module (IPM). The IPM is an IGBT power module 1 with a built in driving circuit for IGBT 13. A driving circuit output control signals a gate of IGBT 13 after receiving a control signal from outside control circuit board. The IPM can be the IGBT 13 connecting a control circuit through the spring terminals 8. That is, one end of a drive circuit is connected to a circuit pattern connected to the spring terminals 8 with a solder. The upper end faces of the main electrodes 25 in the case 2 can be arranged so as to be level with the screw holes 9 for board fastening. In this embodiment, the coil-accommodating member is a cover 7, which can be resin-molded and removable from the case.

The coil-accommodating parts 16 can be made of resin and can be formed integrally with the cover 7 at the positions at which the spring terminals 8 are arranged. Each spring terminal 8 can have coil parts having different outer diameters (described below). In each coil-accommodating part 16 of the cover 7, a terminal lead-out opening 16*a* is formed to have a smaller diameter than the outer diameter of one coil part of the corresponding spring terminal 8, which has a larger outer diameter than that of the other coil part. Thus, the spring terminal 8 is held by the coil-accommodating part 16 while being extended, by the spring flexure tolerance A, from a board contact plane 17 of an external control-circuit board 26 so as not come off the case 2.

The board-fastening screw holes 9 and the positioning pins 10 are formed at predetermined positions in the case 2. The external control-circuit board 26 is positioned using the positioning pins 10, and is then fastened to the IGBT power module 1 through the screw holes 9 with reference to the board contact plane 17. At this time, the coil part of each spring terminal 8 is compressed to a spring set length B by the control-circuit board 26. The flexure tolerance A for the spring terminals 8 is defined by the height of the screw holes 9 for board fastening formed in the case 2, i.e., the position of the board contact plane 17. This prevents excessive pressure from being exerted by the fastened control-circuit board 26 on the in-case substrate 12 through the spring terminals 8, and can ensure adequate contact.

As shown in FIG. 6, each spring terminal 8 has a coil part 20 composed of a first coil part 20*a* with a terminal contact surface 19 at its upper end that is in direct pressure contact with the external control-circuit board 26 and a second coil part 20*b* that is formed integrally and coaxially or substantially coaxially at the other end of the first coil part 20*a* and having a larger outer diameter than that of the first coil part 20*a*, a straight part 21 that is integrally formed at the lower end of the coil part 20 and extending coaxially or substantially coaxially with the coil part 20, and a joining part 22 that is integrally formed at the lower end of the straight part 21 and is soldered or bonded to the corresponding electrode of the in-case substrate.

The first coil part 20*a* of the spring terminal 8 is accommodated in the terminal lead-out opening 16*a* of the corresponding coil-accommodating part 16, while the second coil part 20*b* is accommodated in an aperture 7*a* formed in the cover 7. The terminal lead-out opening 16*a* and aperture 7*a* are formed in the coaxial direction. As the diameter of the aperture 7*a* is larger than that of the terminal lead-out opening 16*a*, a level difference 16*b* is provided at the interface between these parts. When the external control-circuit board 26 is fastened to the case 2 of the IGBT power module 1, the coil part 20 of the spring terminal 8 flexes. This brings the terminal contact surface 19 of the spring terminal 8 into pressure contact with a circuit arranged on the external control-circuit board 26 through an appropriate spring force, and ensures continuity.

The coil-accommodating part 16 is configured to allow insertion of the spring terminal 8 in only one way also in this embodiment. In this embodiment, however, the spring terminal 8 is inserted through the cover 7 from the bottom, with respect to the figures.

The side opposite the terminal contact surface 19 of the spring terminal 8 comprises a straight part 21 for ensuring continuity with the in-case substrate 12. As described in the first embodiment, the straight part 21 has a length corresponding to the distance from the lower end of the coil part 20 to the in-case substrate 12, and the joining part 22 is joined by soldering or bonding to the corresponding electrode of the in-case substrate 12.

The external control-circuit board 26 is generally prepared on the user's side, and the coil part 20 of each spring terminal 8 is handled while being extended from the cover 7 by the spring flexure tolerance A. For this reason, during handling of a conventional IGBT power module or mounting of the control-circuit board 26, the terminal contact surface 19 of the spring terminal 8 can be pulled, thereby generating stress. Accordingly, secure adhesion between the joining part 22 and the in-case substrate 12 may become poor.

In the second embodiment, the level difference 16*b* is provided at the interface between the cover 7 and each coil-accommodating part 16 formed thereon, and the corresponding second coil part 20*b* prevents the spring terminal 8 from coming off the case 2. Thus, even if the terminal contact surface 19 of the spring terminal 8 is pulled, the adhesion to the in-case substrate 12 is not adversely affected. The end of the straight part 21 of the spring terminals 8 connecting to a circuit pattern with either a solder or a conductive adhesive, namely covered with a solder or a conductive adhesive, can have an L-shape, circular shape, etc., other than a linear shape. Such a configuration allows the spring terminals 8 to drop out of the electrodes and maintained on the circuit pattern 12.

To join the spring terminals 8 and in-case substrate 12 together by soldering, heating to approximately 250° C. is necessary. When the spring terminals 8 are subjected to heat, they may be annealed. On the other hand, when a thermosetting conductive adhesive is used, the heating temperature for the setting need only be approximately 150° C. A thermosetting conductive adhesive is advantageous in that it does not require high-temperature heating, and that the spring terminals 8 do not lose their inherent spring characteristics.

FIG. 7 is a detailed view showing how the control terminal in FIG. 6 is positioned by a frame. The frame 15 as a whole can be formed in, e.g., a grid, as in the first embodiment, and can have a large number of apertures. These apertures allow a soldering iron or hot gas access to parts where the spring terminals 8 are joining to the electrodes for control signals of the driving circuits mounted on the in-case substrate 12 while the frame 15 is set in the case. The lower end of the second coil part 20*b* of each spring terminal 8 abuts the tapered spring-terminal pressure-receiving part 23 of the frame 15. When the external control-circuit board 26 is fastened to the case 2, the spring-terminal pressure-receiving part 23 serves as a basis for flexure of the coil part 20. Therefore, stress on the joining part 22 caused by thermal cycles as described above can be prevented by tapering the spring-terminal pressure-receiving part 23.

A semiconductor or electronic device according to the present invention ensures connection to an external control-circuit board using the elastic force of spring terminals. This allows electrical connection to the external control-circuit board without solder. Thus, the semiconductor or electronic device can be attached/detached to/from a control-circuit board freely and easily.

As each spring terminal can be arranged at an arbitrary position inside the side walls of the case, the wiring to the external control-circuit board connected through the spring terminals can be minimized, and the impact of induced noise caused by wiring can be reduced.

Given the disclosure of the present invention, one versed in the art would appreciate that there may be other embodiments and modifications within the scope and spirit of the present invention. Accordingly, all modifications and equivalents attainable by one versed in the art from the present disclosure within the scope and spirit of the present invention are to be included as further embodiments of the present invention. The scope of the present invention accordingly is to be defined as set forth in the appended claims.

This application is based on, and claims priority to, Japanese Application Nos. 2004-169534 and 2004-325948, and the disclosures of the priority applications, in their entirety, including the drawings, claims, and the specifications thereof, are incorporated herein by reference.

What is claimed is:

1. A semiconductor device comprising:

a case;

a substrate with an electrode inside the case;

at least one spring terminal electrically connected to the electrode; and a coil-accommodating member connected to the case, wherein the spring terminal has a coil part with one end for contacting with an external control-circuit board attachable to the case, a straight part formed integrally with the other end, which is opposite the one end of the coil part, and extending substantially coaxially with the coil part, and a terminal end formed integrally with the straight part at the end opposite to the end connecting to the coil part, and joined to the electrode, wherein the coil-accommodating member includes a coil-accommodating part for accommodating the coil part of the spring terminal therein, and wherein the coil accommodating part has an aperture for passage of the coil part.

2. A semiconductor device comprising:

a case;

a substrate with an electrode inside the case;

at least one spring terminal electrically connected to the electrode; and a coil-accommodating member connected to the case, wherein the spring terminal has a coil part with one end for contacting with an external control-circuit board attachable to the case, a straight part formed integrally with the other end, which is opposite the one end of the coil part, and extending substantially coaxially with the coil part, and a terminal end formed integrally with the straight part at the end opposite to the end connecting to the coil part, and joined to the electrode, wherein the coil-accommodating member includes a coil-accommodating part for accommodating the coil part of the spring terminal therein, and wherein the coil-accommodating member has at least one aperture that allows access to the terminal end of the spring terminal while the coil-accommodating member is connected to the case and the coil part is held by the coil-accommodating part.

3. The semiconductor device according to claim 2, wherein the coil-accommodating member is a frame.

4. The semiconductor device according to claim 3, further including a cover that covers the frame while allowing passage of the coil-accommodating part through the cover.

5. A semiconductor device comprising:

a case;

a substrate with an electrode inside the case;

at least one spring terminal electrically connected to the electrode; and a coil-accommodating member connected to the case, wherein the spring terminal has a coil part with one end for contacting with an external control-circuit board attachable to the case, a straight part formed integrally with the other end, which is opposite the one end of the coil part, and extending substantially coaxially with the coil part, and a terminal end formed integrally with the straight part at the end opposite to the end connecting to the coil part, and joined to the electrode, wherein the coil-accommodating member includes a coil-accommodating part for accommodating the coil part of the spring terminal therein, and wherein the coil-accommodating part is configured to allow insertion of the spring terminal in only one way.

6. A semiconductor device comprising:

a case;

a substrate with an electrode inside the case;

at least one spring terminal electrically connected to the electrode;

a coil-accommodating member connected to the case; and a frame, wherein the spring terminal has a coil part with one end for contacting with an external control-circuit board attachable to the case, a straight part formed integrally with the other end, which is opposite the one end of the coil part, and extending substantially coaxially with the coil part, and a terminal end formed integrally with the straight part at the end opposite to the end connecting to the coil part, and joined to the electrode, wherein the coil-accommodating member includes a coil-accommodating part for accommodating the coil part of the spring terminal therein, and wherein the frame has at least one aperture that allows access to the terminal end of the spring terminal while the frame is connected to the case and the coil part is held by the coil-accommodating part.

7. The semiconductor device according to claim 6, wherein the coil-accommodating member is a cover, which covers the frame.

8. A semiconductor device comprising:

a case;

a substrate with an electrode inside the case;

at least one spring terminal electrically connected to the electrode; and a coil-accommodating member connected to the case, wherein the spring terminal has a coil part with one end for contacting with an external control-circuit board attachable to the case, a straight part formed integrally with the other end, which is opposite the one end of the coil part, and extending substantially coaxially with the coil part, and a terminal end formed integrally with the straight part at the end opposite to the end connecting to the coil part, and joined to the electrode, wherein the coil-accommodating member includes a coil-accommodating part for accommodating the coil part of the spring terminal therein, and wherein the coil-accommodating part includes a spring-terminal pressure-receiving part that serves as a basis for flexure of the coil part when the case and the external control-circuit board are fastened together, and the flexure stress in the coil part of the spring terminal is received only by the spring-terminal pressure-receiving part.

9. The semiconductor device according to claim 8, wherein the spring-terminal pressure-receiving part is tapered.

10. A semiconductor device comprising:

a case;

a substrate with an electrode inside the case;

at least one spring terminal electrically connected to the electrode; and a coil-accommodating member connected to the case, wherein the spring terminal has a coil part with one end for contacting with an external control-circuit board attachable to the case, a straight part formed integrally with the other end, which is opposite the one end of the coil part, and extending substantially coaxially with the coil part, and a terminal end formed integrally with the straight part at the end opposite to the end connecting to the coil part, and joined to the electrode, wherein the coil-accommodating member includes a coil-accommodating part for accommodating the coil part of the spring terminal therein, and wherein the coil part of the spring terminal is composed of a first coil part with a small diameter having one end for contacting with the external control-circuit board and a second coil part that is formed integrally and coaxially with the other end of the first coil part and having an outer diameter larger than the outer diameter of the first coil part.

11. The semiconductor device according to claim 10, wherein the coil-accommodating part has an opening smaller than the diameter of the second coil part to prevent the spring terminal from coming out through the opening.

12. The semiconductor device according to claim 1, wherein the terminal end of the spring terminal is joined to the electrode with a solder or a conductive adhesive.

13. The semiconductor device according to claim 12, wherein the terminal end irregularly shaped or ring-shaped.

14. The device according to claim 1, wherein the semiconductor device is a power semiconductor part or power module.

15. An electronic device comprising:

a case;

a substrate with a first electrode inside the case;

an external control-circuit board attached to the case;

at least one spring terminal electrically connected to the electrode and to the external control-circuit board; and a coil-accommodating member connected to the case, wherein the spring terminal has a coil part with one end contacting the external control-circuit board, a straight part formed integrally with the other end, which is opposite the one end of the coil part, and extending substantially coaxially with the coil part, and a terminal end formed integrally with the straight part at the end opposite to the end connecting to the coil part, and joined to the electrode, wherein the coil-accommodating member includes a coil-accommodating part for accommodating the coil part of the spring terminal therein, and wherein the coil accommodating part has an aperture for passage of the coil part.

16. An electronic device comprising:

a case;

a substrate with a first electrode inside the case;

an external control-circuit board attached to the case;

at least one spring terminal electrically connected to the electrode and to the external control-circuit board; and a coil-accommodating member connected to the case, wherein the spring terminal has a coil part with one end contacting the external control-circuit board, a straight part formed integrally with the other end, which is opposite the one end of the coil part, and extending substantially coaxially with the coil part, and a terminal end formed integrally with the straight part at the end opposite to the end connecting to the coil part, and joined to the electrode, wherein the coil-accommodating member includes a coil-accommodating part for accommodating the coil part of the spring terminal therein, and wherein the coil-accommodating member is a frame having at least one aperture that allows access to the terminal end of the spring terminal while the frame is connected to the case and the coil part is held by the coil-accommodating part.

17. The electronic device according to claim 16, further including a cover that covers the frame while allowing passage of the coil-accommodating part through the cover.

18. An electronic device comprising:

a case;

a substrate with a first electrode inside the case;

an external control-circuit board attached to the case;

at least one spring terminal electrically connected to the electrode and to the external control-circuit board;

a coil-accommodating member connected to the case; and a frame, wherein the spring terminal has a coil part with one end contacting the external control-circuit board, a straight part formed integrally with the other end, which is opposite the one end of the coil part, and extending substantially coaxially with the coil part, and a terminal end formed integrally with the straight part at the end opposite to the end connecting to the coil part, and joined to the electrode, wherein the coil-accommodating member includes a coil-accommodating part for accommodating the coil part of the spring terminal therein, wherein the frame has at least one aperture that allows access to the terminal end of the spring terminal while the frame is connected to the case and the coil part is held by the coil-accommodating part, and wherein the coil-accommodating member is a cover that covers the frame.

19. An electronic device comprising:

a case;

a substrate with a first electrode inside the case;

an external control-circuit board attached to the case;

at least one spring terminal electrically connected to the electrode and to the external control-circuit board; and a coil-accommodating member connected to the case, wherein the spring terminal has a coil part with one end contacting the external control-circuit board, a straight part formed integrally with the other end, which is opposite the one end of the coil part, and extending substantially coaxially with the coil part, and a terminal end formed integrally with the straight part at the end opposite to the end connecting to the coil part, and joined to the electrode, wherein the coil-accommodating member includes a coil-accommodating part for accommodating the coil part of the spring terminal therein, and wherein the coil-accommodating part is configured to allow insertion of the spring terminal in only one way.

20. An electronic device comprising:

a case;

a substrate with a first electrode inside the case;

an external control-circuit board attached to the case;

at least one spring terminal electrically connected to the electrode and to the external control-circuit board; and a coil-accommodating member connected to the case, wherein the spring terminal has a coil part with one end contacting the external control-circuit board, a straight part formed integrally with the other end, which is opposite the one end of the coil part, and extending substantially coaxially with the coil part, and a terminal end formed integrally with the straight part at the end opposite to the end connecting to the coil part, and joined to the electrode, wherein the coil-accommodating member includes a coil-accommodating part for accommodating the coil part of the spring terminal therein, and wherein the coil-accommodating part includes a spring-terminal pressure-receiving part that serves as a basis for flexure of the coil part when the case and the external control-circuit board are fastened together, and the flexure stress in the coil part of the spring terminal is received only by the spring-terminal pressure-receiving part.

* * * * *